(12) United States Patent
Fischaber et al.

(10) Patent No.: US 7,433,980 B1
(45) Date of Patent: Oct. 7, 2008

(54) MEMORY OF AND CIRCUIT FOR REARRANGING THE ORDER OF DATA IN A MEMORY HAVING ASYMMETRIC INPUT AND OUTPUT PORTS

(75) Inventors: Scott J. Fischaber, Golden, CO (US); James E. Ogden, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 312 days.

(21) Appl. No.: 11/111,434

(22) Filed: Apr. 21, 2005

(51) Int. Cl.
*G06F 9/315* (2006.01)

(52) U.S. Cl. .................. 710/65; 710/66; 365/189.02

(58) Field of Classification Search .................. None
See application file for complete search history.

(56) References Cited

U.S. PATENT DOCUMENTS

| | | | | |
|---|---|---|---|---|
| 5,446,438 A | * | 8/1995 | Eichfeld | 340/146.2 |
| 5,521,625 A | * | 5/1996 | Morrison | 347/108 |
| 6,061,449 A | * | 5/2000 | Candelore et al. | 380/28 |
| 7,149,901 B2 | * | 12/2006 | Herbert et al. | 713/190 |
| 2003/0037190 A1 | * | 2/2003 | Alexander et al. | 710/52 |
| 2004/0233733 A1 | * | 11/2004 | Peel et al. | 365/189.01 |

* cited by examiner

*Primary Examiner*—B. James Peikari
(74) *Attorney, Agent, or Firm*—John J. King

(57) ABSTRACT

Circuits and methods of rearranging the order of data in a memory having asymmetric input and output ports are disclosed. According to one embodiment, a method comprises steps of providing an input port of a memory having an input width and output port having an output width which is different than the input width. A plurality of data words are received at the input of the memory, wherein each data word has a width corresponding to the input width. The order of the plurality of input data words is rearranged; and an output word based upon the rearranged data words and having a width corresponding to the output width is generated. Various circuits and algorithms for implementing the methods are also disclosed.

18 Claims, 4 Drawing Sheets

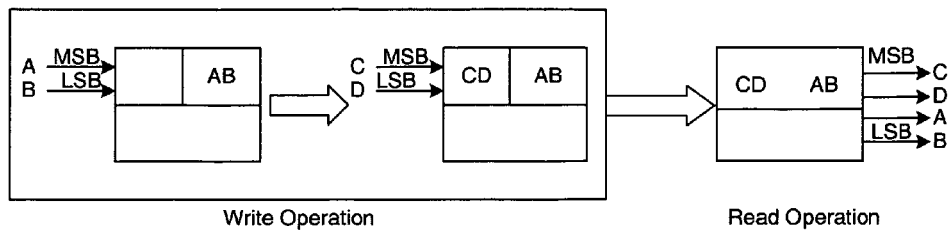
Write Operation        Read Operation
FIG. 1
-- Prior Art --
| Data Width | Port Data Address | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 1 | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 09 | 08 | 07 | 06 | 05 | 04 | 03 | 02 | 01 | 00 |
| 2 | 15 | | 14 | | 13 | | 12 | | 11 | | 10 | | 09 | | 08 | | 07 | | 06 | | 05 | | 04 | | 03 | | 02 | | 01 | | 00 | | |
| 4 | 07 | | | | 06 | | | | 05 | | | | 04 | | | | 03 | | | | 02 | | | | 01 | | | | 00 | | | | |
| 8 | 03 | | | | | | | | 02 | | | | | | | | 01 | | | | | | | | 00 | | | | | | | | |
| 16 | 01 | | | | | | | | | | | | | | | | 00 | | | | | | | | | | | | | | | | |
| 32 | 00 | | | | | | | | | | | | | | | | | | | | | | | | | | | | | | | | |
FIG. 2
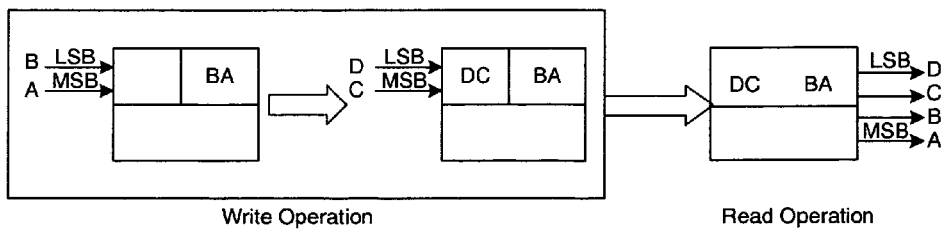
Write Operation        Read Operation
FIG. 3

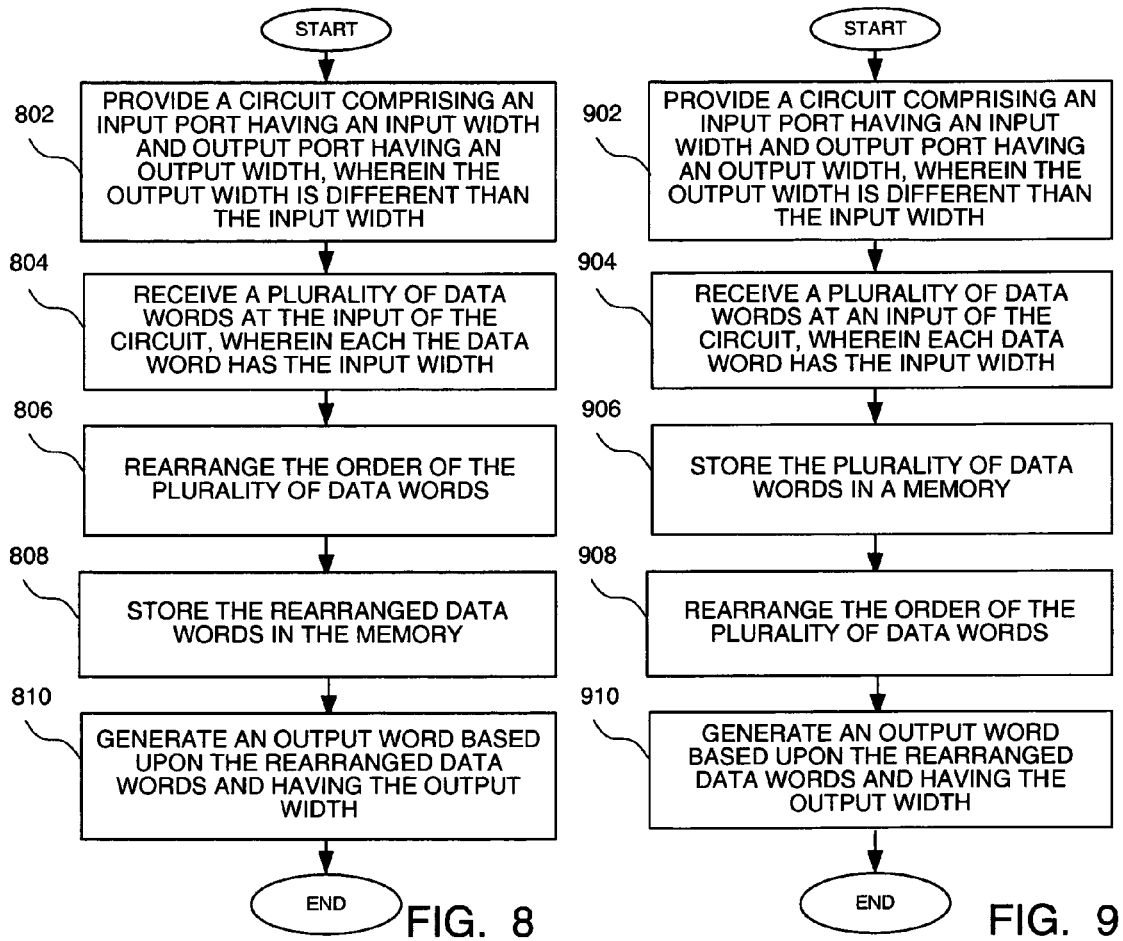

MEMORY OF AND CIRCUIT FOR REARRANGING THE ORDER OF DATA IN A MEMORY HAVING ASYMMETRIC INPUT AND OUTPUT PORTS

FIELD OF THE INVENTION

The present invention relates generally to memory devices, and in particular, to a method of and circuit for rearranging the order of data in a memory having asymmetric input and output ports.

BACKGROUND OF THE INVENTION

Blocks of random access memories (RAMS), often called Block RAMs or BRAMs, are dedicated resources used for data storage in programmable logic devices (PLDs), such as Field Programmable Gate Arrays (FPGAs) or complex programmable logic devices (CPLDs). Block RAMS can have a variety of depths, output data widths for the output port, and input data widths for the input port. The ratio of the width of the output port to the input port is referred to as the aspect ratio. Some memory, including block RAMs, allow any aspect ratio that is a power of two (e.g., ½, 1, 2, 4 . . . ).

A typical memory with an aspect ratio of one works as expected. That is, whatever is written into the most significant bit (MSB) is read out as the MSB, with the remaining bits following. For example, if the input data width is four and '1000' is written into the memory at address X, then '1000' will be read from address X. In a conventional memory with an aspect ratio of greater than one, the address to which data is written can be controlled. That is, the user writes data over several cycles into specific addresses so that when the data is read out of the MEMORY, it will contain the correct bit in the MSB. However, such read/write operations become problematic when using sequential operations, such as first-in first-out (FIFO) memories, stacks, initialization, etc. For these special-purpose memories, the sequential operations to the memory may occur in a manner inconsistent with the structure of the memory, leading to incorrect ordering or corrupted data.

The example of FIG. 1 shows a write and a read operation using a conventional memory. Because the aspect ratio of the memory of FIG. 1 is greater than one (i.e. two in this case where the output width is four and the input width is two), the left side of the figure illustrates two write cycles and the right side illustrates one read cycle. With a 4-bit memory having a 2-bit input data bus, there are two sectors because to fill a 4-bit section would require two writes. The read operation shows the memory having a 4-bit output data bus. Because the 4-bit bus can read the entire section in one read, there is only one sector. When the sequence 'ABCD' is written into the memory in two write cycles, the first write places the MSB 'A' and the next bit 'B' into the memory. The second write places 'C' and the LSB 'D' into the memory. This data is read from the memory in one read cycle because the output port is 4-bits wide. Instead of reading 'A' as the MSB, 'C' is the first in the sequence. The sequence 'CDAB' is read out of the memory rather than the sequence 'ABCD'. Accordingly, the data that was written into the memory is corrupted. This corruption occurs anytime that the aspect ratio is greater than one as a result of the intrinsic way that a conventional memory scales to handle ports with different aspect ratios.

FIG. 2, which shows the data addressing for all possible aspect ratios, further illustrates the problem of reading data when a memory has an aspect ratio which is greater than one. The first row illustrates the addressing of a memory if it was 1-bit wide and 16384 deep. The second row illustrates if the memory is 2-bits wide and 8192 deep. Using the example from FIG. 1, if 'AB' is written into the second row it would be placed in the 00 slot. 'CD' would then be placed in the 01 slot. The read operation is a 4-bit wide bus, which is demonstrated by the third row. It reads the data in the memory, putting slot 01 from the second row in the MSB and slot 00 from the second row in the LSB. Therefore, the sequence 'CDAB' is read from the memory instead of the sequence 'ABCD' which was written into the memory.

Accordingly, there is a need for an improved circuit for and method of outputting data from a memory having asymmetric input and output ports.

SUMMARY OF THE INVENTION

Circuits and methods of rearranging the order of data in a memory having asymmetric input and output ports are disclosed. According to one embodiment, the method comprises steps of providing an input port of a memory having an input width and output port having an output width which is different than the input width. A plurality of data words are received at the input port of the memory, wherein each of the data words has the input width. The order of the plurality of input data words is rearranged, and an output word based upon the rearranged data words and having the output width is generated. According to an alternate embodiment, a method of outputting data from a memory having asymmetric ports comprises providing an input port and an output port, wherein the ratio of the output width to the input width is a factor of two, and the output word comprises a word representing a plurality of input words output on a first-in first-out basis.

A circuit for outputting data is also disclosed. In particular, a FIFO circuit adapted to receive data having a first width and to output data having a second width is provided. The FIFO circuit comprises an input having a first width for receiving data having a first number of bits; a memory coupled to the input for storing data received at the input; an output having a second width for outputting data having a second number of bits stored in the memory. Finally, a reordering circuit coupled to the memory changes the order of the input data having the first width to generate output data having the second width.

BRIEF DESCRIPTION OF THE DRAWINGS

FIG. 1 is a block diagram of a conventional circuit for writing data to and reading data from a memory having asymmetric ports;

FIG. 2 is a table showing the port address mapping of a memory according to an embodiment of the present invention;

FIG. 3 is a block diagram of a circuit for writing data to and reading data from a memory having asymmetric ports according to an embodiment of the present invention;

FIG. 8 is a flow chart showing a method of rearranging data input to a memory according to an embodiment of the present invention;

FIG. 9 is a flow chart showing a method of rearranging data output by a memory according to an embodiment of the present invention;

DETAILED DESCRIPTION OF THE DRAWINGS

Turning first to FIG. 3, a block diagram of a circuit for writing data to and reading data from a memory having asymmetric ports according to an embodiment of the present invention is shown. One way to read the correct data from a memory with an aspect ratio greater than one is to reverse the order that the ports are connected (i.e. the LSB of the input data bus is connected to the MSB of the memory input bus). Because the output ports are switched by reversing the order of the input and output buses, the problem of different aspect ratios is solved. For example, FIG. 3 illustrates what happens in the above example when the input and output ports are flipped. Now the two writes into the block memory are 'BA' and 'DC'. If the data was read out normally, then the sequence would then be 'DCBA', but reversing the order of the output ports gives the correct sequence 'ABCD'.

While this approach works for all of the different aspect ratios, it has some drawbacks. First, the user must connect the ports in reverse order in order to use different aspect ratios. In addition, it is not feasible to reverse the ports in all situations, leading to data corruption. For example, the initial value of the output bus of the memory can sometimes be controlled by a constant value, which is asserted onto the bus on reset. However, reversing this output port will have the effect of corrupting the reset value. An algorithm according to another aspect of the invention described in more detail below in reference to FIG. 4 provides a solution to address this problem.

Figure 4:
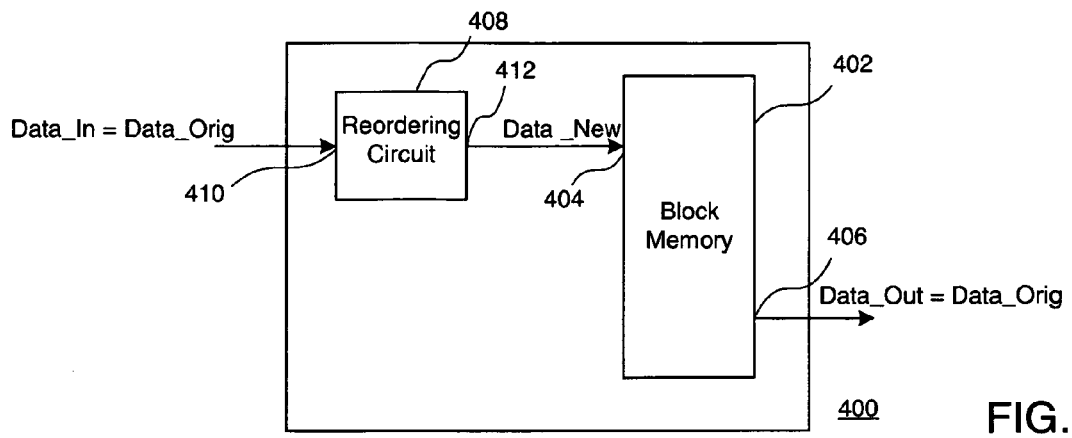
FIG. 4 is a block diagram of a circuit for writing data having a first width and reading data having a second width according to an embodiment of the present invention.

Turning now to FIG. 4, a block diagram of a circuit for writing data having a first width and reading data having a second width according to an embodiment of the present invention is shown. In particular, a circuit 400 comprises a memory 402 having an input port 404 and an output port 406. Depending upon the needs of the user, the input port and the output port could have different values. As will be described in more detail below, the memory could be implemented in a programmable logic device, and therefore, the widths of the input port and the output port of the memory could be selected by a user. Because the data output by the circuit 400 (Data_Out) would be corrupted by employing a conventional circuit having a memory with different sized input and output ports, the circuit 400 comprises a reordering circuit 408 which receives input data (Data_In) at an input 410 as data having an original order (Data_Orig). Data is preferably converted to binary data before the order of the data is rearranged. The reordering circuit outputs rearranged data (Data_New) at an output 412, where the order of the input data is rearranged to generate Data_New. For example, the input data could include two bit data words received in a predetermined order, while the rearranged data output by the circuit could comprise 4 bit data words. Rearranging the data on the input to the memory would require a buffer to store up a number of bits equaling the width of the output port. Accordingly, the reordering circuit could comprise a buffer at least as large as the greatest possible output width. Once these bits were stored, the order of the data stored in the buffer could be rearranged. The process of rearranging the order of the data so that the output data is not corrupted will be described in more detail in reference to FIG. 5.

Figure 5:
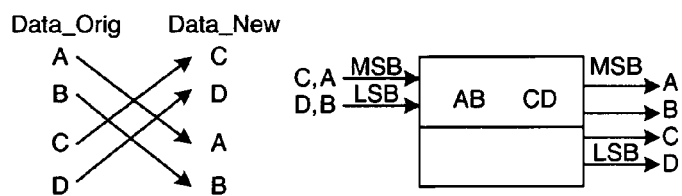
FIG. 5 is a diagram showing the rearranging of data words input to a memory according to an embodiment of the present invention.

Turning now to FIG. 5, a diagram shows the rearranging of data words input to a memory according to an embodiment of the present invention. Such rearranging could be performed by the reordering circuit 408 of FIG. 4, for example. Considering an example of an aspect ratio of 2, FIG. 5 shows the transformation necessary on the input vector to achieve the correct bit sequence at the output. That is, to read the correct sequence 'ABCD' from the memory, the input bits must be rearranged. Therefore, instead of writing the sequence 'AB' and then 'CD' into the memory, the sequence 'CD' then 'AB' is written. This guarantees that the data read will be in the correct order when output. This transformation can be represented by two equations using New to represent the data after transformation and Old to represent data before transformation. Referring back to FIG. 4, the old data is the Data_Orig sequence 'ABCD' and the new data is the reordered sequence 'CDAB' output as Data_New.

$$\text{New}[1 \text{ to } 2] = \text{Old}[3 \text{ to } 4] \quad\quad 1.$$

$$\text{New}[3 \text{ to } 4] = \text{Old}[1 \text{ to } 2] \quad\quad 2.$$

Because the circuit of the present invention enable outputting data from a memory having an aspect ratio other than one, each aspect ratio requires a specific transformation so that the output will be correct. Accordingly, Equations 1 and 2 can then be generalized for any size output port as shown in Equations 3 and 4 by using a variable Dout_w which represents the output port width. Using FIG. 4 as an example, Dout_w would be 4. Replacing Dout_w with 4 in equations 3 and 4 will give the same equations as 1 and 2.

$$3.\ \text{New}\left[1 \text{ to } \frac{\text{Dout\_w}}{2}\right] = \text{Old}\left[\frac{\text{Dout\_w}}{2} + 1 \text{ to } \text{Dout\_w}\right]$$

$$4.\ \text{New}\left[\frac{\text{Dout\_w}}{2} + 1 \text{ to } \text{Dout\_w}\right] = \text{Old}\left[1 \text{ to } \frac{\text{Dout\_w}}{2}\right]$$

Equations 3 and 4 apply for any port width as long as the aspect ratio is 2 (e.g. input data width of 5 and output data width of 10). Equations 3 and 4 can also be represented by a single equation, shown as Equation 5, where i goes from 1 to 2.

$$5.\ \text{New}\left[(i-1)*\left(\frac{\text{Dout\_w}}{2}\right)+1 \text{ to } i*\left(\frac{\text{Dout\_w}}{2}\right)\right] =$$
$$\text{Old}\left[(2-i)*\left(\frac{\text{Dout\_w}}{2}\right)+1 \text{ to } (3-i)*\left(\frac{\text{Dout\_w}}{2}\right)\right]$$

The same process can be applied to aspect ratios of 4 and 8. Using the aspect ratio as the variable Ratio (where Ratio is 1, 2, 4, or 8), a general equation can be developed for any supported aspect ratio and output data bus width. The general equation is shown in Equation 6, where i goes from 1 to Ratio. Once again using the example from FIG. 4, Dout_w is 2, Ratio is 2, and i goes from 1 to 2. Using these values in Equation 6 will yield equations 1 and 2.

$$6. \text{New}\left[(i-1)*\left(\frac{\text{Dout\_w}}{\text{Ratio}}\right)+1 \text{ to } i*\left(\frac{\text{Dout\_w}}{\text{Ratio}}\right)\right] =$$
$$\text{Old}\left[(\text{Ratio}-i)*\left(\frac{\text{Dout\_w}}{\text{Ratio}}\right)+1 \text{ to } (\text{Ratio}+1-i)*\left(\frac{\text{Dout\_w}}{\text{Ratio}}\right)\right]$$

Accordingly, Equation 6 transforms the input data words, based on the aspect ratio and the output data bus width, so that the output data will match the original input data words. That is, Equation 6, which handles the reordering of an arbitrary number of bits for an arbitrary ration, is particularly useful for flexible parameterizable code, such as FPGA cores. VHDL code for implementing the equations for rearranging the order of data according to one aspect of the present invention is submitted before the claims.

One advantage of the circuit of FIG. 4 is that it does not require bus reversal when the memory is implemented in a larger circuit. Rather, the input and output ports can be connected normally, and the data output by the memory can be automatically rearrange so that it corresponds to the data originally written into the memory. Further, no additional resources are required to reorder the bits. The reordering of data is also particularly beneficial when a memory initialization is performed using an initialization vector.

Figure 6:
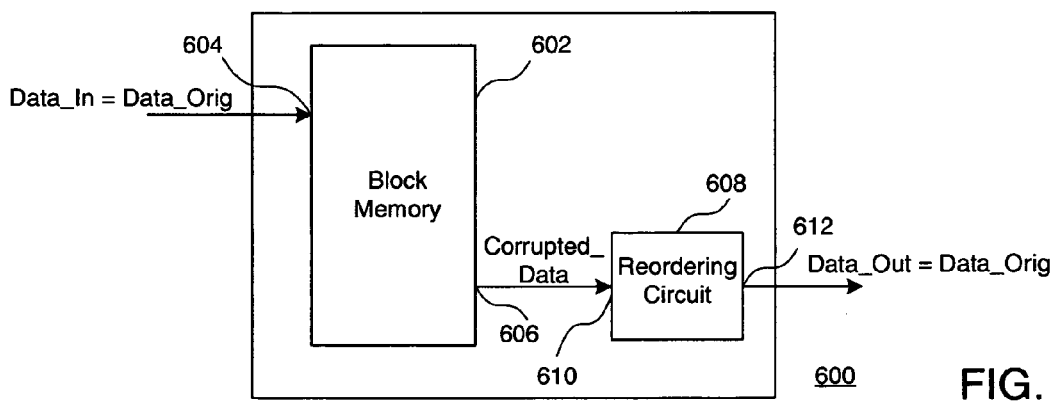
FIG. 6 is a block diagram of a circuit for writing data having a first width and reading data having a second width according to an alternate embodiment of the present invention.

Turning now to FIG. 6, a block diagram of a circuit for writing data having a first width and reading data having a second width according to an alternate embodiment of the present invention is shown. In particular, circuit 600 comprises a memory 602 having an input port 604 coupled to receive input data (Data_In) which comprises data in an original order (Data_Orig). Because data is output as corrupted data (Corrupted_Data) when read from the conventional memory at an output port 606 for the reasons described above, a reordering circuit 608 (which receives the corrupted data at an input port 610) outputs rearranged data as output data (Data_Out) which is equal to the data input in the original order (Data_Orig).

Figure 7:
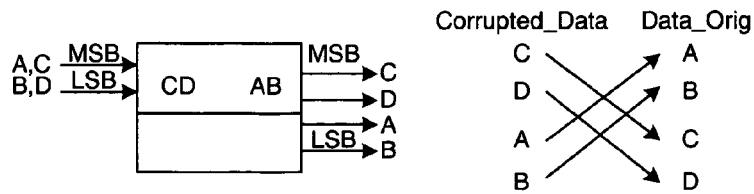
FIG. 7 is a diagram showing the rearranging of data words output from a memory according to an embodiment of the present invention.

The diagram of FIG. 7 shows the rearranging of corrupted data words output from a memory according to an embodiment of FIG. 6. That is, when the data is written into the memory in the normal sequence ('ABCD'), it is read out of the memory in the incorrect order. Using the various equations described in reference to FIG. 4, the reordering circuit will also rearrange the bits in the appropriate order so that the Data_Out is in the same order as the Data_Orig.

Turning now to FIG. 8, a flow chart shows a method of rearranging data input to a memory according to an embodiment of the present invention. A circuit comprising an input port having an input width and output port having an output width is provided at a step 802. The circuit could be for example the circuit of FIG. 4, or some other suitable circuit, where the output width of the memory is different than the input width. A plurality of data words is received at the input of the circuit at a step 804, wherein each data word has a width corresponding to the input width. The order of the plurality of data words is rearranged at a step 806. The rearranged data words are stored in the memory at a step 808. The order could be rearranged for example according to the Equations 1-6 described in reference to FIG. 4. Finally, an output word is generated based upon the rearranged data words and having a width corresponding to the output width at a step 810.

Turning now to FIG. 9, a flow chart shows a method of rearranging data output by a memory according to an embodiment of the present invention. A circuit comprising an input port having an input width and output port having an output width is provided at a step 902. The circuit could be, for example, the circuit of FIG. 6 or some other suitable circuit, where the output width is different than the input width. A plurality of data words at an input of the circuit is received at a step 904, wherein each data word has a width corresponding to the input width. The plurality of data words is stored in a memory at a step 906. The order of the plurality of data words is rearranged at a step 908, and an output word is generated based upon the rearranged data words and having the output width at a step 910.

Figures 10, 11:
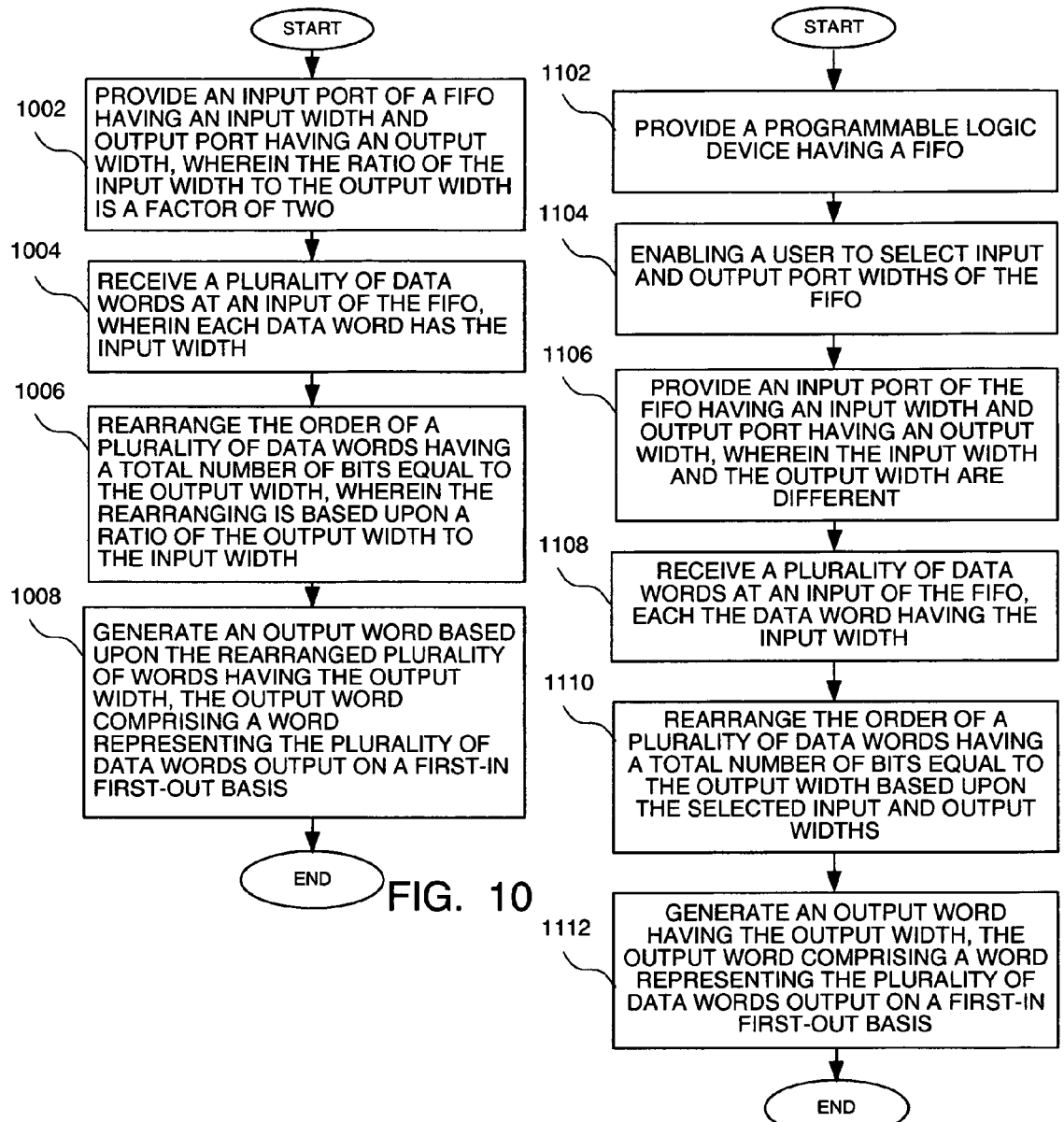
FIG. 10 is a flow chart showing a method of rearranging the order of data words based upon a ratio of an output width to an input width according to an embodiment of the present invention.
FIG. 11 is a flow chart showing a method of rearranging the order of data words input to a FIFO of a programmable logic device according to an embodiment the present invention.

Turning now to FIG. 10, a flow chart shows a method of rearranging the order of data words output by a FIFO based upon a ratio of output words to input words according to an embodiment of the present invention. An input port of a FIFO having an input width and output port having an output width is provided at a step 1002, wherein the ratio of the output width to the input width is a factor of two. A plurality of data words is received at an input of the FIFO at a step 1004, wherein each data word has a width corresponding to the input width. The order of a plurality of data words (i.e. a predetermined number of words having a total number of bits equal to the output width) is rearranged at a step 1006, wherein the rearranging is based upon the ratio of the output width to the input width. An output word based upon the rearranged plurality of words and having a width corresponding to the output width is generated at a step 1008. That is, the output word comprises a word representing the plurality of input data words output on a first-in first-out basis in the correct order.

Turning now to FIG. 11, a flow chart shows a method of rearranging the order of data words input to a FIFO of a programmable logic device according to an embodiment the present invention. A programmable logic device having a FIFO is provided at a step 1102. Because the memory is implemented in a programmable logic device, a user is enabled to select input and output port widths of the FIFO at a step 1104. An input port of the FIFO having an input width and output port having an output width is established at a step 1106, wherein the input width and the output width are different. A plurality of data words is received at an input of the FIFO at a step 1108, wherein each data word has a width corresponding to the input width. The order of a plurality of data words having a total number of bits equal to the output width is rearranged based upon the selected input and output widths at a step 1110. An output word having a width corresponding to the output width is generated at a step 1112, wherein the output word comprises a word representing the plurality of data words output on a first-in first-out basis.

It can therefore be appreciated that the new and novel circuit for and method of rearranging the order of data in a memory having asymmetric ports has been described. It will be appreciated by those skilled in the art that numerous alternatives and equivalents will be seen to exist which incorporate the disclosed invention. As a result, the invention is not to be limited by the foregoing embodiments, but only by the following claims.

The following text contains a hardware description language (VHDL code) description for implementing the equations for rearranging the order of data in accordance with an embodiment of the invention. The code reproduced in this patent document contains material subject to copyright protection. The copyright owner of that material has no objection to the facsimile reproduction of the patent document or the

```
-- This function will flip the word order of the DOUT reset
value

FUNCTION flip_order (
  direction integer;
  C_RATIO_W : integer;
  C_DIN_WIDTH : integer;
  C_DOUT_WIDTH : integer;
  C_DOUT_RST_VAL : string)
  RETURN string IS
  VARIABLE C_DOUT_RST_VAL_TMP : string(1 TO
    (C_DOUT_WIDTH+3)/4);
  VARIABLE C_DOUT_RST_VAL_BIN : string(1 TO
    C_DOUT_WIDTH);
  VARIABLE C_DOUT_RST_VAL_NEW : string(1 TO
    C_DOUT_WIDTH);
  VARIABLE C_DOUT_RST_VAL_RTN : string(1 TO
    (C_DOUT_WIDTH+3)/4);
  VARIABLE C_DOUT_RST_VAL_LENGTH : integer
    :=C_DOUT_RST_VAL 'LENGTH;
  BEGIN -- flip_order
    --Assign, character by character, all HEX values
    -- from the unsized input (C_DOUT_RST_VAL) to the
    -- sized variable (C_DOUT_RST_VAL_TMP).
    Pad with 0's if C_DOUT_RST_VAL isn't long enough.
    FOR t IN 1 TO (C_DOUT_WIDTH+3)/4 LOOP
      IF    t<=    ((C_DOUT_WIDTH+3)/4-C_D-
        OUT_RST_VAL_LENGTH) THEN
        C_DOUT_RST_VAL_TMP(t) := '0';
      ELSE
        C_DOUT_RST_VAL_TMP(t)          :=
          C_DOUT_RST_VAL(t-((C_DOUT_WIDTH+
          3)/4-C_DOUT_RST_VAL_LENGTH));
      END IF;
    END LOOP; -- t
    -- If direction=0, this means there is no flipping, so just
      assign
    -- new reset value to the temp value.
    -- OR, if C_RATIO_W=1 (no asymmetric ports), then
      the reset
    -- value remains unchanged.
    IF direction=0 OR C_RATIO_W=1 THEN
      C_DOUT_RST_VAL_RTN           :=
        C_DOUT_RST_VAL_TMP;
    END IF;
    -- If directional and we have asymmetric ports (with
      WR_DEPTH>RD_DEPTH),
    -- then we need to flip the DOUT reset value.
    IF direction=1 AND C_RATIO_W>1 THEN
      --Convert the Hex string to a binary string
      C_DOUT_RST_VAL_BIN := hex_to_bin_str (C_D-
        OUT_RST_VAL_TMP, (C_DOUT_WIDTH+3)/
        4, C_DOUT_WIDTH);
        --If the width of input and output is wide enough
          that there is at
        -- least one hex digit (4 bits), then use math to flip
          around
        -- the slices.
        --
        --Ex: WR_WIDTH = 4
        -- RD_WIDTH = 16
        -- C_DOUT_RST_VAL = ABCD
        -- Flipped: = DCBA
        --
        --Ex: WR_WIDTH = 8
        -- RD_WIDTH = 16
        -- C_DOUT_RST_VAL = ABCD
        Flipped: = CDAB
        FOR i IN 1 TO C_RATIO_W LOOP
          C_DOUT_RST_VAL_NEW(((i-1)*(C_D-
            OUT_WIDTH/C_RATIO_W))+1 to (i)*(C_D-
            OUT_WIDTH/C_RATIO_W))          :=
            C_DOUT_RST_VAL_BIN(((C_RATIO_W -
            i)*(C_DOUT_WIDTH/C_RATIO_W)+1)    to
            (C_RATIO_W + 1 - i)*(C_DOUT_WIDTH/
            C_RATIO_W));
        END LOOP;
        -- Convert the binary string back to a HEX string
        C_DOUT_RST_VAL_RTN   :=bin_to_hex_string
          (C_DOUT_RST_VAL_NEW,C_D-
          OUT_RST_VAL_RTN' length);
    END IF;
    RETURN C_DOUT_RST_VAL_RTN;
  END flip_order;
```

The invention claimed is:

1. A method of rearranging the order of data in a circuit comprising a memory having asymmetric input and output ports, said method comprising the steps of:
providing an input port of said memory having an input width and output port having an output width, wherein said output width is greater than said input width;
receiving a plurality of data words in a predetermined order at an input port of said circuit, wherein each of said plurality of data words has a width corresponding to said input width and said plurality of data words is to be stored in a row of said memory over a plurality of write cycles;
rearranging the order of said plurality of data words; and
generating an output word based upon said rearranged plurality of data words and having a width corresponding to said output width, wherein said output word comprises said plurality of data words in an order which is different than said predetermined order and is generated during a single read cycle.

2. The method of claim 1 wherein said step of rearranging the order of said plurality of data words comprises a step of reordering said plurality of data words based upon said output width.

3. The method of claim 1 wherein said step of rearranging the order of said plurality of data words comprises a step of rearranging the order of said plurality of data words based upon an aspect ratio of said output width to said input width.

4. The method of claim 3 wherein said step of rearranging the order of said plurality of data words based upon an aspect ratio of said output width to said input width comprises a step of rearranging the order of said plurality of data words based upon an aspect ratio being a factor of two.

5. The method of claim 4 wherein said step of rearranging the order of said plurality of data words comprises a step of rearranging the order of an initialization vector.

6. The method of claim 1 wherein said step of generating an output word comprises a step of generating an output word comprising a plurality of input words which are arranged according to a first-in first-out order of said input words.

7. The method of claim 1 wherein said step of generating an output word comprises a step of generating an output word from a most significant bit of said first word input to said memory to a least significant bit of said last word input to said memory.

8. A method of rearranging the order of data in a circuit comprising a memory having asymmetric input and output ports, said method comprising the steps of:

provide an input port of said memory having an input width and output port having an output width, wherein the aspect ratio of said output width to said input width is greater than one and a factor of two;

receiving a plurality of data words in a predetermined order at an input of said circuit to be stored in a row of said memory over a plurality of write cycles, each of said data words having a width corresponding to said input width;

rearranging the order of said plurality of data words; and generating an output word having a width corresponding to said output width, said output word comprising a word representing said plurality of data words which are arranged in an order which is different than said predetermined order and generated during a single read cycle.

9. The method of claim 8 wherein said step of rearranging the order of said plurality of data words comprises a step of rearranging the order of said plurality of data words based upon an output width.

10. The method of claim 8 wherein said step of generating an output word comprises a step of generating an output word from a most significant bit of said first word input to said memory to a least significant bit of said last word input to said memory.

11. The method of claim 8 wherein said step of rearranging the order of said plurality of data words comprises a step of rearranging the order of a plurality of data words input to said memory.

12. The method of claim 8 wherein said step of rearranging the order of said plurality of data words comprises a step of rearranging the order of a plurality of data words output by said memory.

13. A FIFO circuit adapted to receive data having a first width and to output data having a second width, said FIFO circuit comprising:

an input having a first width for receiving data having a first number of bits;

a memory coupled to said input for storing data comprising a plurality of words received at said input in a predetermined order and to be stored in a row of said memory over a plurality of write cycles, said memory having a width greater than said first width;

an output having a second width for outputting data having a second number of bits stored in said memory, wherein said second number of bits is greater than said first number of bits and said data having said second number of bits comprises said plurality of words received at said input; and a reordering circuit coupled to said memory, said reordering circuit changing the order of said data having said first width input to said circuit to generate an output word, wherein said output word comprises said plurality of words received at said input arranged in a different order than said predetermined order and is output in a single read cycle.

14. The FIFO circuit of claim 13 wherein the ratio of said second width of said output to said first width of said input is a factor of two.

15. The FIFO circuit of claim 13 wherein said reordering circuit comprises a reordering circuit coupled to receive data at said input, wherein said reordering circuit rearranges the order of said data to be stored in said memory.

16. The FIFO circuit of claim 13 wherein said reordering circuit comprises a reordering circuit coupled to receive data output by said memory, wherein said reordering circuit rearranges the order of said data output by said memory.

17. The FIFO circuit of claim 13 wherein said reordering circuit rearranges the order of said data based upon said second width of said output.

18. The FIFO circuit of claim 13 wherein said reordering circuit rearranges the order of said data based upon said ratio of said second width of said output to said first width of said input.

* * * * *